United States Patent
Hartner et al.

(10) Patent No.: US 6,586,348 B2
(45) Date of Patent: Jul. 1, 2003

(54) METHOD FOR PREVENTING ETCHING-INDUCED DAMAGE TO A METAL OXIDE FILM BY PATTERNING THE FILM AFTER A NUCLEATION ANNEAL BUT WHILE STILL AMORPHOUS AND THEN THERMALLY ANNEALING TO CRYSTALLIZE

(75) Inventors: Walter Hartner, Glen Allen, VA (US); Günther Schindler, München (DE); Frank Hintermaier, München (DE); Volker Weinrich, Paris (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/850,585

(22) Filed: May 7, 2001

(65) Prior Publication Data

US 2001/0055890 A1 Dec. 27, 2001

Related U.S. Application Data

(63) Continuation of application No. PCT/DE98/03249, filed on Nov. 6, 1998.

(51) Int. Cl.[7] .................. H01L 21/31; H01L 21/469; H01L 21/8242; H01L 21/20
(52) U.S. Cl. .................. 438/785; 438/240; 438/396; 427/126.3
(58) Field of Search .................. 427/126.3; 438/3, 438/240, 785, 778, 396–399

(56) References Cited

U.S. PATENT DOCUMENTS

| | | | |
|---|---|---|---|
| 5,374,578 A | * 12/1994 | Patel et al. | 438/3 |
| 5,434,102 A | 7/1995 | Watanabe et al. | |
| 6,025,619 A | * 2/2000 | Azuma et al. | 257/295 |
| 6,133,092 A | * 10/2000 | Hayashi et al. | 438/256 |

FOREIGN PATENT DOCUMENTS

| JP | 06350050 | 12/1994 |
|---|---|---|
| JP | 10223845 | 8/1998 |
| WO | WO 98/05071 | 2/1998 |

OTHER PUBLICATIONS

Machine translation of JP 10–223845, Satoru et al.*

* cited by examiner

Primary Examiner—Carl Whitehead, Jr.
Assistant Examiner—Erik Kielin
(74) Attorney, Agent, or Firm—Laurence A. Greenberg; Werner H. Stemer; Gregory L. Mayback

(57) ABSTRACT

After an SBT layer is precipitated onto a substrate, the SBT layer is structured as a still amorphous layer. Only subsequently is it subjected to a crystallization process. Layers produced in this manner have a relatively high degree of dielectric strength and have no stoichiometric deviations on the etched edges.

3 Claims, 5 Drawing Sheets

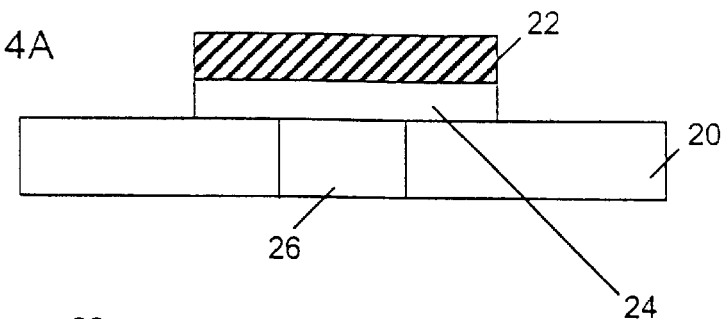
FIG. 4A
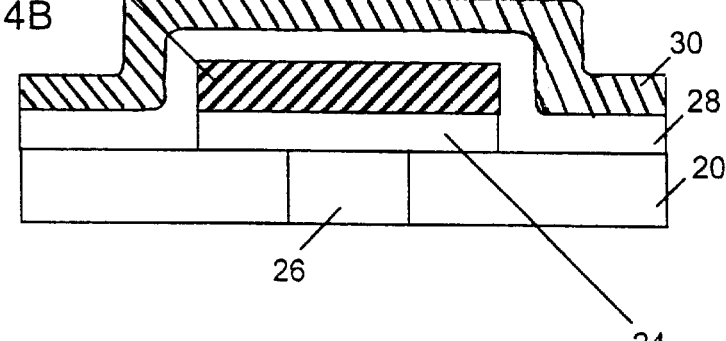
FIG. 4B
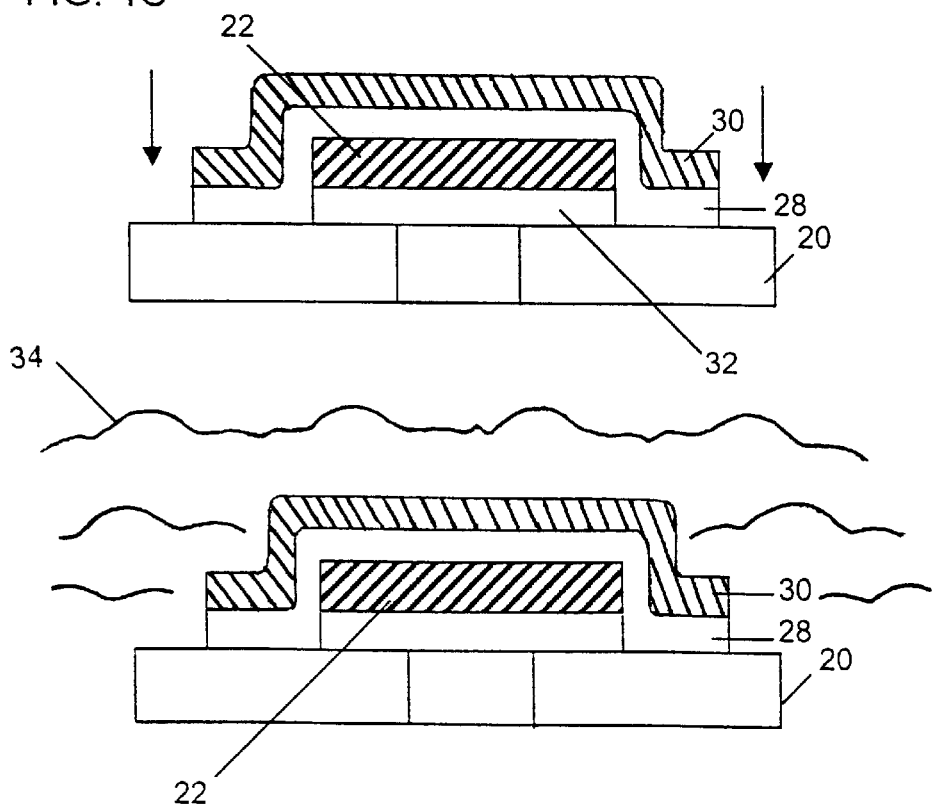
FIG. 4C
FIG. 4D

METHOD FOR PREVENTING ETCHING-INDUCED DAMAGE TO A METAL OXIDE FILM BY PATTERNING THE FILM AFTER A NUCLEATION ANNEAL BUT WHILE STILL AMORPHOUS AND THEN THERMALLY ANNEALING TO CRYSTALLIZE

CROSS-REFERENCE TO RELATED APPLICATION:

This application is a continuation of copending International Application PCT/DE98/03249, filed Nov. 6, 1998, which designated the United States.

BACKGROUND OF THE INVENTION

Field of the Invention

The invention lies in the field of semiconductor technology and relates to a method for fabricating a patterned laser containing metal-oxide.

Layers of this general type are provided for use, in future applications, inter alia as a capacitor dielectric in semiconductor memories, since these layers have high dielectric constants or are ferroelectric.

Therefore, the term metal-oxide-containing layer as used herein should be understood to be layers having a dielectric constant $\epsilon > 10$ and also ferroelectric layers. The latter are characterized in particular by their ability to maintain a remanent (permanent) polarization which can be reversed by an electric field. In the event of the polarization reversal, the polarization of the metal-oxide-containing layer in this case follows a hysteresis which is characteristic of the respective layer. To ensure that these layers have the dielectric or ferroelectric properties sought, they must generally be present in polycrystalline form.

Metal-oxide-containing layers comprise either a metal oxide, such as, for example, tantalum oxide ($Ta_2O_3$) or titanium oxide ($TiO_2$), or a mixture of at least two metal oxides. The latter are also commonly designated as ABO class, where O denotes oxygen and A and B denote metals selected from the group of strontium, calcium, barium, bismuth, cadmium, lead, titanium, tantalum, hafnium, tungsten, niobium, zirconium, scandium, yttrium, lanthanum, antimony, chromium and tallium. These metal oxides or metal oxide mixtures form crystal lattices or crystal superlattices, the latter being understood to mean the successive alternation of a plurality of sublattices. The general ABO class also subsumes substitution mixed crystals and isomorphs of the above metal oxides. A typical crystal structure is, for example, the layer perovskite structure which occurs for example in strontium bismuth tantalate ($SrBi_2Ta_2O_9$).

A method for fabricating a patterned metal-oxide-containing and polycrystalline layer is described for example in U.S. Pat. No. 5,434,102. There, a metal-oxide-containing layer is initially applied to a substrate. The still amorphous layer is then briefly heated in order to induce crystallization nuclei and subsequently subjected to a thermal treatment. In the process, the metal-oxide-containing layer completely crystallizes into a polycrystalline layer which can then be patterned. It is unfavorable, however, that layers that are fabricated and patterned in this way exhibit stoichiometric deviations which, in particular in the case of very fine patterning on the micron and submicron scale (feature size approximately equal to or less than 1 $\mu$m) can lead to impairment of the dielectric or ferroelectric properties sought. One consequence of these stoichiometric deviations is that the electrical loadability of the metal-oxide-containing layer is reduced. However, this is undesirable in particular in the case of large scale integrated semiconductor devices, for example in the case of semiconductor memories.

SUMMARY OF THE INVENTION

The object of the present invention is to provide a method of fabricating a metal-oxide-containing layer which overcomes the above-noted deficiencies and disadvantages of the prior art devices and methods of this general kind, and which leads to a durable layer.

With the above and other objects in view there is provided, in accordance with the invention, a method of fabricating a patterned metal-oxide-containing layer, which comprises the following method steps:

providing a substrate;

applying a substantially amorphous metal-oxide-containing layer to the substrate;

immediately following the applying step, performing a nucleation process to form crystallization nuclei in the substantially amorphous metal-oxide-containing layer;

patterning the substantially amorphous metal-oxide-containing layer; and subsequently thermally treating the metal-oxide-containing layer to form a substantially polycrystalline metal-oxide-containing layer.

In accordance with an added feature of the invention, an electrode layer is deposited, before the patterning step, onto the substantially amorphous metal-oxide-containing layer and the electrode layer is patterned together with the metal-oxide-containing layer.

In accordance with an additional feature of the invention, the method comprises forming the metal-oxide-containing layer from a material selected from the group consisting of strontium bismuth tantalate, strontium bismuth niobate tantalate, lead zirconium titanate, barium strontium titanate, lead lanthanum titanate, lead lanthanum zirconium titanate, bismuth titanate, and a derivative of these metal oxides.

In accordance with a concomitant feature of the invention, the nucleation process is performed immediately following the applying step.

In other words, the method has as its basic concept that the thermal treatment during which the applied metal-oxide-containing layer, which is initially still essentially amorphous, is subjected to a crystallization process is carried out only after the patterning of the metal-oxide-containing layer. This produces particularly robust metal-oxide-containing layers which, for example, have a low leakage current. What is furthermore characteristic of the layers thus produced is that the stoichiometric ratios are only insignificantly affected by the patterning and the thermal treatment.

The layers thus fabricated prove to be particularly stable under electrical loading ranging to electrical breakdown. By contrast, in the case of the layers fabricated by previously known methods, macroscopically observable damage is often detected, which is attributable to changes in the metal-oxide-containing layer during patterning. In these layers, the damage is located predominately in the edge region and, therefore, has a pronounced effect in particular in the case of finely patterned layers (micron and submicron scale).

The relatively high mobility of some metal oxides is a suspected cause for explaining this damage. These metal oxides can diffuse relatively easily along grain boundaries or evaporate during the patterning of the thermally treated and hence polycrystalline metal-oxide-containing layer from the etched edge regions of the metal-oxide-containing layer. In particular the polycrystalline structure of the thermally treated metal-oxide-containing layer favors diffusion of highly mobile metal oxides which have a tendency to diffuse. Since these are often volatile as well and evaporate, in particular the edge regions of the metal-oxide-containing layer are disrupted. On account of the evaporation, there is a change in the stoichiometric ratio of the metal-oxide-containing layer and thus in the dielectric or ferroelectric properties sought. One consequence is e.g. a reduced breakdown strength.

Furthermore, the mobile metal oxides that have a tendency to diffuse can diffuse relatively rapidly as far as active regions of devices and influence the latter irreversibly.

By contrast, such damage is avoided by fabricating the metal-oxide-containing layer by the method according to the invention. The reason is that the metal-oxide-containing layer is patterned before its crystallization. In this case, the metal-oxide-containing layer is present essentially still in amorphous form, so that diffusion paths formed by grain boundaries are still absent. Rather, the amorphous metal-oxide-containing layer is only removed in layers by the patterning, with the result that possible evaporation of metal oxides can only take place from the topmost and thus extremely thin layer. Therefore, possible disturbances can only extend to a few atomic layers and, in contrast to already polycrystalline layers, due to the diffusion that is facilitated there, do not extend relatively far into the layer itself.

As a result, after the patterning, a largely undisturbed amorphous layer is thus present which is subsequently crystallized by the thermal treatment.

The metal-oxide-containing layer is essentially amorphous before the patterning and the thermal treatment. This state is present immediately after the deposition of the metal-oxide-containing layer and is characterized by a non-crystalline structure which may possibly already have a few crystallites, these being relatively small, however. Furthermore, essentially amorphous metal-oxide-containing layers do not yet have the dielectric or ferroelectric properties sought, i.e. the dielectric constant is relatively low, or as yet no remanent polarization or only a vanishing small remanent polarization can be brought about.

In order to improve or bring about the dielectric or ferroelectric properties, these layers must therefore be to subjected to crystallization, these layers then being essentially polycrystalline after crystallization. The aim here is crystallization that is as complete as possible, with the formation of relatively large crystal domains, since it is precisely these crystal domains which determine the desired properties.

The method according to the invention is preferably used for fabricating semiconductor memory elements in which the memory element is formed by a dielectric or ferroelectric capacitor. In this case, the metal-oxide-containing layer serves as a capacitor dielectric situated between two electrodes.

Preferably, before the patterning of the essentially amorphous metal-oxide-containing layer, an electrode layer is deposited onto the essentially amorphous metal-oxide-containing layer and is patterned together with the latter.

It has been shown that the subsequently deposited electrode layer protects the relatively sensitive metal-oxide-containing layer during patterning. Moreover, joint patterning of the electrode layer and of the metal-oxide-containing layer reduces the number of process steps.

Furthermore, it is expedient, before the thermal treatment, to carry out a nucleation process in order to form crystallization nuclei in the essentially amorphous metal-oxide-containing layer.

This step is, for example, a so-called Rapid Thermal Process (RTP), in which, by means of relatively brief heating of the metal-oxide-containing layer, first nuclei are formed in said layer but complete crystallization is as yet not effected. Complete crystallization is only effected afterward during the thermal treatment under optimum conditions therefor.

The nucleation process can either be carried out immediately after the application of the essentially amorphous metal-oxide-containing layer, or follow the patterning of the metal-oxide-containing layer.

The metal-oxide-containing layer preferably comprises strontium bismuth tantalate (SBT), strontium bismuth niobate tantalate (SBTN), lead zirconium titanate (PZT), barium strontium titanate (BST), lead lanthanum titanate (PLT), lead lanthanum zirconium titanate (PLZT), bismuth titanate (BTO) or a derivative of the above metal oxides.

Other features which are considered as characteristic for the invention are set forth in the appended claims.

Although the invention is illustrated and described herein as embodied in a method for fabricating a patterned metal-oxide-containing layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS:

FIGS. 4a to 4d are diagrammatic side views showing individual process steps for fabricating a polycrystalline metal-oxide-containing layer;

DESCRIPTION OF THE PREFERRED EMBODIMENTS:

The method according to the invention will be explained below with reference to the fabrication of an SBT layer in the context of integration in a semiconductor memory. The ferroelectric SBT (strontium bismuth tantalate) in question should preferably lie close to the ideal stoichiometry of $SrBi_2Ta_2O_9$ and have a perovskite-like crystal structure.

Figure 1:
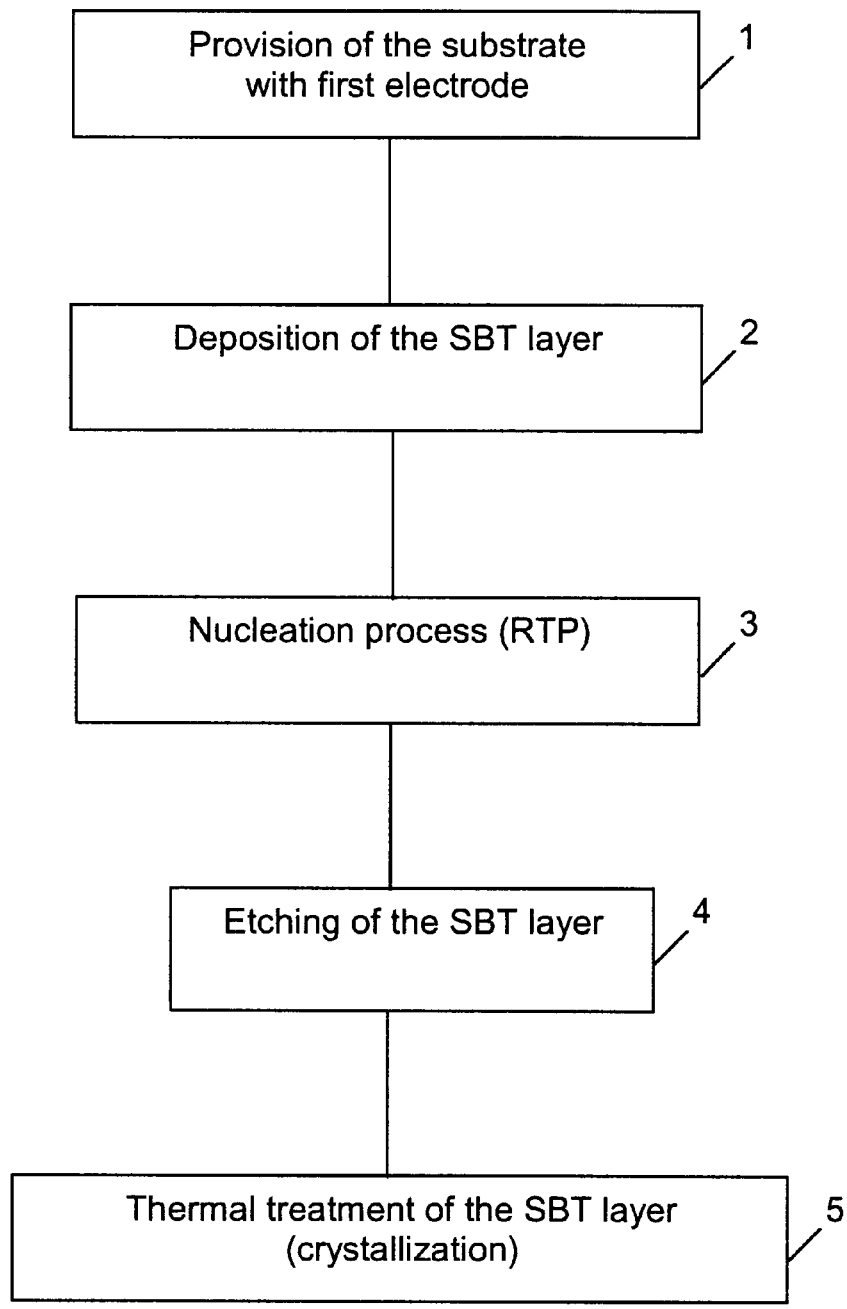
FIG. 1 is diagrammatic flowchart illustrating a method sequence according to the invention.

Referring now to the figures of the drawing in detail and first, particularly, to FIG. 1 thereof, the primary step is to provide a semiconductor body (1). The latter usually comprises a silicon base substrate in which active components, for example field-effect transistors, are integrated. The silicon base substrate is covered by a planarizing insulation layer which is usually composed of $SiO_2$. This insulation layer shall represent the substrate hereinafter.

Situated on the substrate is at least one first electrode, which is preferably composed of platinum and has a height of about 50 to 300 nm. Other preferred electrode materials are ruthenium, iridium and the conductive oxides thereof. An SBT layer is subsequently deposited (2) onto the substrate. This is preferably effected by means of metal organic chemical vapor deposition (MOCVD) in a suitable CVD reactor. Before the deposition, the starting products are provided in the form of volatile metal complexes. Beta-diketonates are preferably used as complexing agents. The starting products are introduced into the CVD reactor and in the process they are mixed with an oxidizing agent, e.g. $O_2$ or $N_2O$. The latter serves to oxidize the metal complexes, with the result that metal oxides can be deposited as an amorphous layer onto the substrate and the electrode situated thereon.

The deposition of the SBT layer is followed by a nucleation process 3, which is carried out in the form of a rapid thermal process (RTP). This step is relatively short and lasts only a few seconds, a temperature for nucleation being set between 500 and 800° C., preferably between 600 and 750° C. First crystal nuclei are formed during the nucleation process (3), but they cannot grow further on account of the relatively short treatment duration, with the result that even after this step, the SBT layer is still essentially amorphous.

In a subsequent process step, the SBT layer is anisotropically etched (4) using a mask. Favorable results can be achieved with etching processes with a high physical component. Such etching processes use an argon plasma, for example. Assistance may also be provided by chlorine ions being contained in the plasma, which, in addition to the physical removal, also have a chemical component.

Finally, the crystallization or thermal treatment (5) of the SBT layer takes place at about 750° C. for about one hour in an oxygen-containing atmosphere. In the process, the crystallization nuclei already formed grow at the expense of the amorphous portions of the SBT layer, which leads to an essentially polycrystalline layer. The crystallization should preferably be effected in such a way as to produce a grain size that is as uniform as possible, in which case the individual grains must not become too large in order that the relatively thin SBT layer (approximately 20 to 180 nm, preferably approximately 40 to 150 nm) has a surface roughness that is not excessive.

Figure 2:
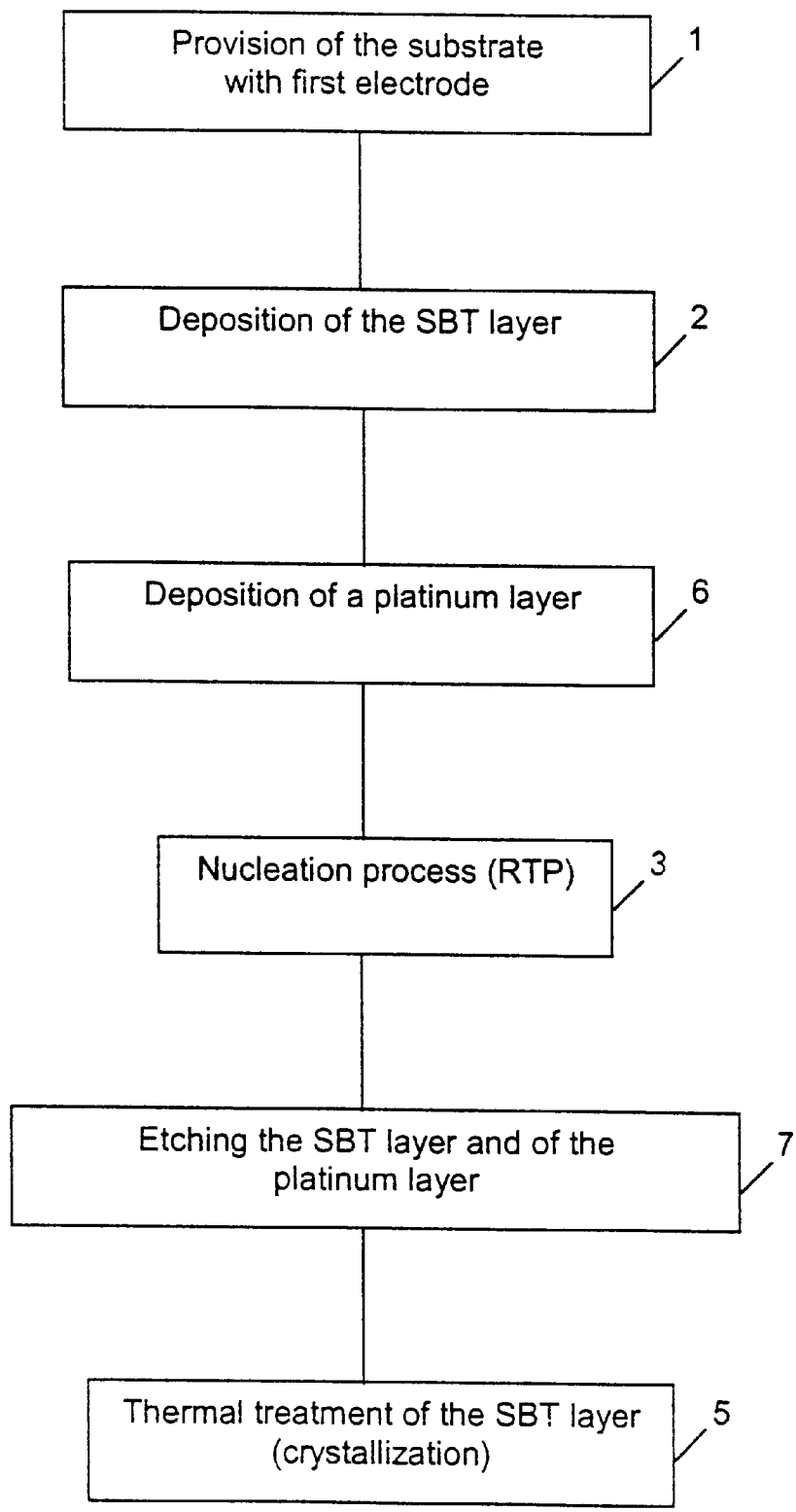
FIG. 2 is a flowchart illustrating a first variant of the invention.

FIG. 2 illustrates a further method sequence, in which a platinum layer is additionally deposited in order to form a second electrode. The method steps (1) and (2) are identical to those illustrated in FIG. 1. After the deposition (2) of the SBT layer, a platinum layer is now also applied (6) over the whole area, this preferably being effected by means of a sputtering process. The platinum layer obtained has a material thickness of about 50 to 200 nm.

There then follows the nucleation process (3) already illustrated in FIG. 1. Afterward, the platinum layer and the SBT layer are jointly etched anisotropically in an argon plasma. The presence of chlorine also assists the etching effect in this etching step.

Finally, the crystallization step (5) already illustrated in FIG. 1 is also performed.

Figure 3:
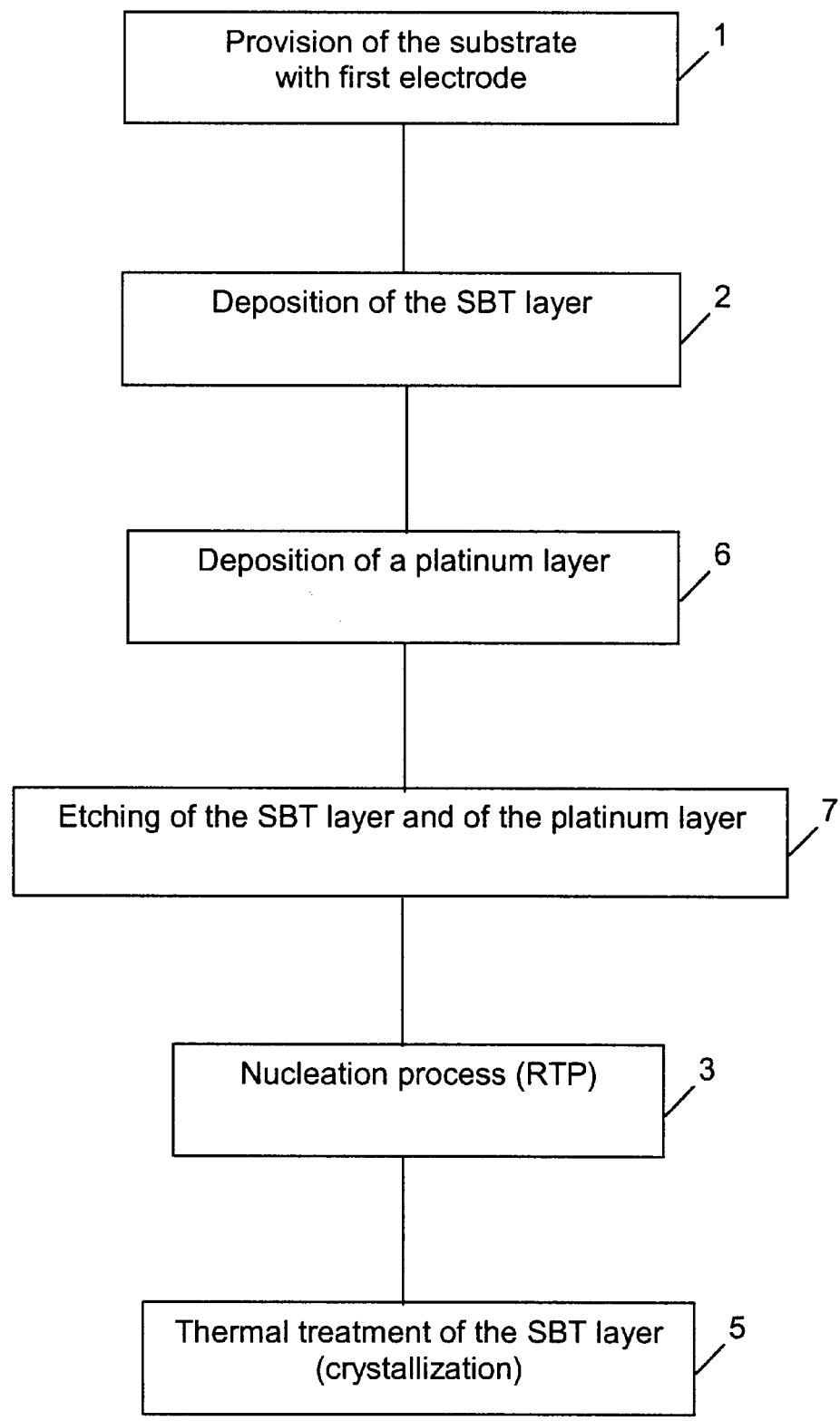
FIG. 3 is a flowchart illustrating a second variant of the invention.

A further possible modification of the fabrication method according to the invention is illustrated in FIG. 3. This modification differs from the method sequence described in FIG. 2 to the effect that the nucleation process (3) is not performed until after the etching or patterning (7) of the SBT and platinum layers.

What is common to all the method sequences described above is, however, the fact that the thermal treatment for crystallizing the SBT layer is effected only after the patterning of the SBT layer, with the result that the SBT layer is still etched as an essentially amorphous layer.

In principle, the nucleation process (3) can be carried out at any time between the deposition of the SBT layer and the thermal treatment (5), that is to say before or after the etching (4, 7) of the SBT layer, or before and after the deposition (6) of the platinum layer.

The method sequence will now be explained with reference to the structures shown in FIGS. 4a to 4d. First, a substrate 20 is provided. This corresponds to the method step (1). The substrate 20 is an $SiO_2$ layer on which is arranged a first electrode 22 with a barrier layer 24 situated underneath. In this exemplary embodiment, the first electrode 22 comprises platinum and the barrier layer 24 comprises e.g. a titanium/titanium nitride combination or other suitable materials. The barrier layer 24 is intended to prevent, in particular, diffusion of the platinum at elevated process temperatures into the substrate 20 and into a contact hole 26 that is situated there and is filled with a conductive material. Polycrystalline silicon is preferably used as the conductive material. The contact hole 26 connects the first electrode 22 to a source or drain region of a non-illustrated selection transistor.

The substrate 20 provided in this way subsequently has an SBT layer 28 applied to it. The deposition is effected in the manner described above, in the case of which firstly an amorphous SBT layer 28 is produced. Afterward, a platinum layer 30 is applied over the entire area of the SBT layer by means of a sputtering process.

There then follows an RTP step by means of which first crystallization nuclei are formed within the SBT layer 28. Optionally, this RTP step may also be performed after the patterning that then follows, or before the deposition of the platinum layer 30. The structure thus obtained is illustrated in FIG. 4b.

The SBT layer 28 is then etched anisotropically together with the platinum layer 30 in accordance with method step (7). This is indicated by the arrows shown in FIG. 4c. The structure illustrated in this figure is produced as a result. The etching (4) is performed in such a way that the side regions 32 of the bottom electrode 22 are still completely covered by the SBT layer 28, since these are intended to contribute to the storage capacitance.

Finally, the thermal treatment (5) for crystallization of the SBT layer 28 is effected, this being indicated by the wavy lines 34 in FIG. 4d.

In accordance with the method sequences illustrated in FIGS. 1 to 3, the steps shown in FIGS. 4a to 4d can be suitably altered in order to fabricate the SBT layer 28. In particular, it is possible for the second electrode 32 to be deposited as a whole-area layer onto the SBT layer 28 after the latter has been separately patterned.

The SBT layers fabricated by the method according to the invention were furthermore characterized with regard to their ferroelectric properties. To that end, comb-like test structures were produced whose comb teeth had different structural widths given the same overall base area of the individual comb-like structures. This means that the overall periphery increases in a comb-like structure with a smaller structural width. The comb-like structures comprise a layer stack formed from a bottom platinum electrode, an SBT layer, and a top platinum electrode.

Figure 5:
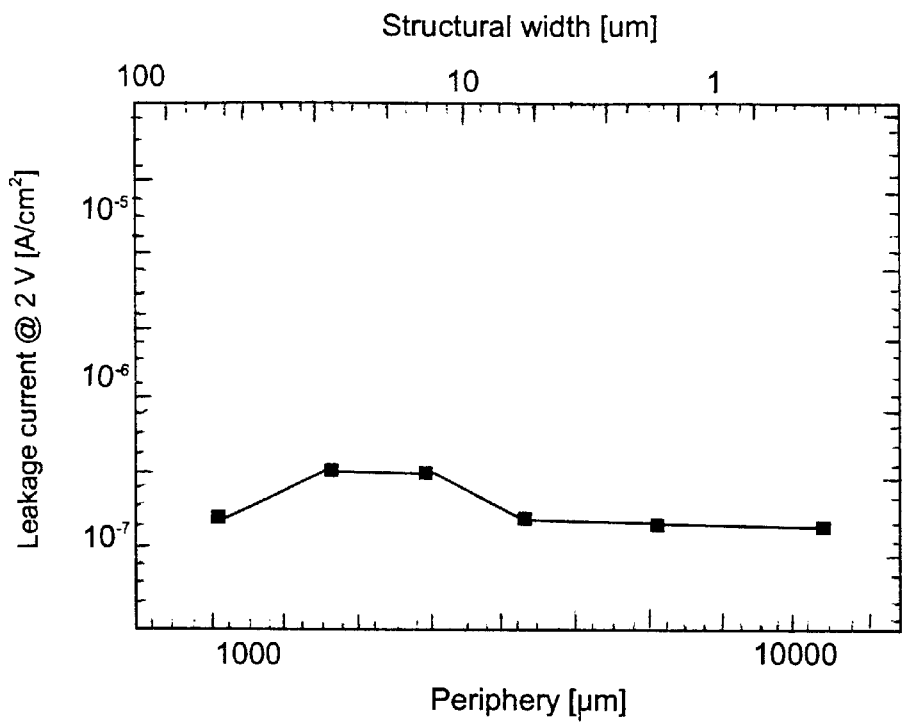
FIG. 5 is a graph charting the leakage current behavior of the metal-oxide-containing layer.
Figure 6:
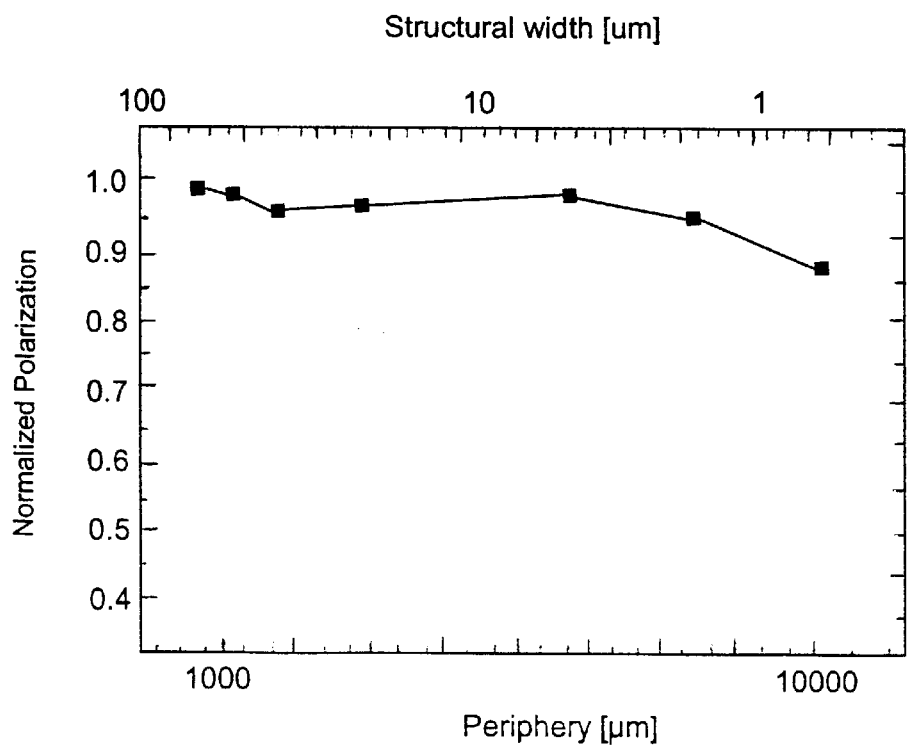
FIG. 6 is a graph charting the polarization behavior of a metal-oxide-containing layer.

As shown in FIG. 5, the SBT layers fabricated according to the invention have a low leakage current even at small structural widths (less than 1 μm). This is an indication of layers having a relatively high breakdown strength. A second important characterization parameter is the level of remanent polarization, which is plotted in FIG. 6. Here, too, it can clearly be seen that the polarization remains relatively constant even in the case of small structures. Such a result could not be determined in the case of the SBT layers fabricated by previously known methods.

We claim:

1. A method of fabricating a patterned metal-oxide-containing layer, which comprises the following method steps:

providing a substrate;

applying a substantially amorphous metal-oxide-containing layer to the substrate;

performing a nucleation process immediately following the applying step, to form crystallization nuclei in the substantially amorphous metal-oxide-containing layer;

patterning the substantially amorphous metal-oxide-containing layer; and subsequently thermally treating the metal-oxide-containing layer to form a substantially polycrystalline metal-oxide-containing layer.

2. The method according to claim 1, which further comprises, before the patterning step, depositing an electrode layer onto the substantially amorphous metal-oxide-containing layer and patterning the electrode layer together with the metal-oxide-containing layer.

3. The method according to claim 1, which comprises forming the metal-oxide-containing layer from a material selected from the group consisting of strontium bismuth tantalate, strontium bismuth niobate tantalate, lead zirconium titanate, barium strontium titanate, lead lanthanum titanate, lead lanthanum zirconium titanate, bismuth titanate, and a derivative of these metal oxides.

* * * * *